(12) United States Patent
Tadauchi et al.

(10) Patent No.: US 6,186,390 B1
(45) Date of Patent: Feb. 13, 2001

(54) SOLDER MATERIAL AND METHOD OF MANUFACTURING SOLDER MATERIAL

(75) Inventors: Masahiro Tadauchi; Kouichi Teshima, both of Tokyo; Izuru Komatsu, Kanagawa; Mitsuhiro Tomita, Tokyo, all of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/220,343

(22) Filed: Dec. 24, 1998

(30) Foreign Application Priority Data

Dec. 26, 1997 (JP) .................................................. 9-361431

(51) Int. Cl.⁷ .................................................. B23K 35/14
(52) U.S. Cl. .................................................. 228/56.3
(58) Field of Search ............................... 228/56.3, 180.22, 228/246

(56) References Cited

U.S. PATENT DOCUMENTS

| | | | | |
|---|---|---|---|---|
| Re. 30,348 | * | 7/1980 | Hascoe .................................... | 228/56 |
| 327,873 | * | 10/1885 | Foote . | |
| 1,248,506 | * | 12/1917 | Lavine . | |
| 2,362,893 | * | 11/1944 | Durst . | |
| 4,297,416 | * | 10/1981 | Krug et al. .............................. | 428/576 |
| 4,725,509 | * | 2/1988 | Ryan ........................................ | 428/607 |
| 4,988,035 | * | 1/1991 | Ueno et al. .............................. | 228/175 |
| 5,086,966 | * | 2/1992 | Melton et al. ........................... | 228/208 |
| 5,330,090 | * | 7/1994 | Iwai .......................................... | 228/56.3 |
| 5,360,158 | * | 11/1994 | Conn et al. .............................. | 228/56.3 |
| 5,366,140 | * | 11/1994 | Koskenmaki et al. ................ | 228/246 |
| 5,390,080 | * | 2/1995 | Melton et al. ........................... | 361/765 |
| 5,957,364 | * | 9/1999 | Socha ...................................... | 228/56.3 |

FOREIGN PATENT DOCUMENTS

| | | |
|---|---|---|
| 5-154687 | 6/1993 | (JP) . |
| 8-164496 | 6/1996 | (JP) . |

OTHER PUBLICATIONS

Metals Handbook vol. 8, 8th Ed., p. 336, 1973.*

* cited by examiner

Primary Examiner—Patrick Ryan
Assistant Examiner—Kiley Stoner
(74) Attorney, Agent, or Firm—Oblon, Spivak, McClelland, Maier & Neustadt, P.C.

(57) ABSTRACT

Disclosed is a solder material and a manufacturing method thereof. The solder material has a first layer composed of a first metallic material and a second layer composed of a second metallic material which is different from the first metallic material, the first layer being formed in an elongated shape having axiality, and the second layer covering the first layer to surround the axis of the first layer. The solder material is in a form of a wire, a granule, a sheet, a tape or a planar fragment. The manufacturing method includes: covering a first metallic material with a second metallic material which is different from the first metallic material to prepare a covered body; and rolling the covered body to prepare a solder material comprising a first layer formed of the first metallic material in an elongated shape having axiality and a second layer covering the first layer to surround an axis of the first layer. The solder material may be cut to granulate the solder material, and the second layer can be deformed during or after cutting.

21 Claims, 5 Drawing Sheets

SOLDER MATERIAL AND METHOD OF MANUFACTURING SOLDER MATERIAL

BACKGROUND OF THE INVENTION

1. Field of the Invention

The present invention relates to a solder material useful for bonding of various metallic members such as electronic parts, mechanical parts and the like, and to a manufacturing method thereof. More particularly, the present invention relates to a solder material containing no lead and enabling to form a suitable bond in joining of metallic members, and to a manufacturing method thereof.

2. Related Art

Soldering is an art for bonding a substance by using a substance having a low melting point, and has been used since old times. It is generally said that the origin of the soldering can be traced up to ancient Mesopotamian civilization. In current industries, soldering is widely used in assembling of mechanical parts and bonding of electronic devices. In regard to the electronic devices, the solder is used for bonding in a mounting process for mounting electronic parts such as semiconductors, microprocessors, memories, resistors and the like to a substrate. Its advantage is not only to fix a part to the substrate, but also to form electrical connection by electric conductivity of the metal contained in the solder. This point is different from organic series adhesive agents.

The solder which is generally used is eutectic solder composed of tin and lead, having a eutectic point of 183° C. This is used for bonding sheet materials of aluminum, copper or the like. It is characterized by the eutectic point which is not only lower than the melting point of metallic base material to be soldered, but also lower than a temperature in which gasification of thermosetting resin begins. Further, it has been known that tin component of the eutectic solder forms a particular intermetallic compound on an interface with a copper plate, thereby intensifying bonding strength between the solder and copper. In addition to the eutectic solder composed of tin and lead having such a characteristic, solder composed of tin and zinc, solder composed of silver and tin. etc. have been used on trial. However, their wettabilities are poor, thereby providing a poor connectability. Thus they have not been used in actual fields.

As described above, bonding by soldering is still important in manufacture of electronic devices. In today's world in which personal electronic devices such as personal computer, mobile telephone and pager have been spreading quickly, the importance of solder in electronic device mounting technology has been intensified.

Spreading of electronic devices contributes to enrichment of people's life. However, on the contrary, if a large amount of electronic devices disused are scrapped, there is a fear that wasted electronic devices may pollute the environment. In view of this. recycle of electronic devices and manufacturing without use of harmful substances have been advocated. In particular, removal of harmful substances is desired for prevention of environmental pollution, and it is also required to develop in the art of bonding with solder.

From such a condition, bonding skill by using solder containing no lead has been demanded. However, solder in which lead is substituted with other metal or solder containing a combination of other metals cannot be handled at such a low temperature that bad influence upon the base metal by high temperatures can be avoided, and the wettability is so poor that the solder is not fixed to the base metal satisfactorily. Thus, such a solder can be applied to neither fine soldering treatment such as mounting in semiconductor devices or ordinary bonding by solder. Particularly, solder with tin and zinc has too many problems to be solved, therefore, it is considered impossible to use it for actual application in electronic mounting.

To enable use of solder without lead in fine soldering works such as thick film formation, conductor circuit formation and semiconductor mounting, a screen printing method using solder paste in which solder powder and flux are mixed has been proposed. The flux used in solder paste is generally classified to organic compound, inorganic compound and resin as shown in Japanese Industrial Standard Z3284. In the case when organic compound or resin is used, halogen salt, organic acid salt and the like of organic acid and amino group are frequently added as active ingredient. In the case of inorganic compound, ammonium halide, zinc halide, tin halide, phosphoric acid, hydroacid halide or the like are often added. Since these additives corrode metals, inspection for corrosion due to flux residue after reflowing of solder paste is necessary. Moreover, organic substance evaporating when paste is heated to remove flux, must be treated.

SUMMARY OF THE INVENTION

It is therefore the primary object of the present invention to solve the problems in the prior art as described above and to provide a novel solder material which contains metals applicable for wide fields, instead of lead which may cause environmental pollution when a product using such a solder is wasted, and which is suitable for mounting electronic parts on a substrate.

Another object of the present invention is to provide a method of manufacturing a novel solder material;

Still another object of the present invention is to provide a novel solder material In order to accomplish the above objects, the solder material, according to the present invention, comprises a first layer composed of a first metallic material and a second layer composed of a second metallic material which is different from the first metallic material, the first layer being formed in an elongated shape having axiality, and the second layer covering the first layer to surround the axis of the first layer.

In one aspect of the invention, the first metallic material contains zinc, and the second metallic material does not substantially contain zinc but contains tin.

In the above, wherein the solder material is a substantially binary solder material which contains zinc at a content of approximately 3 to 12% by weight, and wherein the oxygen content of the solder material is 100 ppm or less.

In another aspect, the solder material is in a form of a wire, a granule round or substantially spherical, or a planar form selected from the group consisting of a sheet, a tape and a planar fragment.

In order to accomplish the above objects, the method of manufacturing a solder material, according to the present invention comprises the steps of: covering a first metallic material with a second metallic material which is different from the first metallic material to prepare a covered body; and rolling the covered body to prepare a solder material comprising a first layer formed or the first metallic material in an elongated shape having axiality and a second layer covering the first layer to surround an axis of the first layer.

In one aspect of the invention, the covered body at the rolling step is rolled in such a manner that the covered body is drawn in one direction, thereby the solder material is prepared in a form of a wire in which the first layer has uniaxiality.

In another aspect, the manufacturing method further comprises, after the rolling step, the step of: cutting the solder material in a direction intersecting the axis of the first layer to granulate the solder material.

In the above it is possible that the solder material at the cutting step is forcingly cut with deformation of the solder material so that the second layer is deformed to substantially completely cover the first layer.

In the above, it is also possible that the manufacturing method further comprises, after the cutting step, the step of: deforming the second layer of the granulated solder material by application of force or heat.

In the above, it is possible that the granulated solder material at the deforming step is deformed round or substantially spherical.

In another aspect, the covered body at the rolling step is rolled in such a manner that the covered body is drawn in two directions, thereby the solder material is prepared in a form of a sheet in which the first layer has biaxiality.

In the above, the manufacturing method may further comprises, after the rolling step, the step of: cutting the solder material in a form of a tape.

In the above, it is possible that the the solder material at the cutting step is forcingly cut with deformation of the solder material so that the second layer is deformed to substantially completely cover the first layer.

In the above, the manufacturing method may alternatively comprises, after the rolling step, the step of: cutting the solder material in a form of a planar fragment.

In the above, It Is possible that the solder material at the cutting step is forcingly cut with deformation of the solder material so that the second layer is deformed to substantially completely cover the first layer.

In another aspect, the first metallic material contains zinc, and the second metallic material does not substantially contain zinc but contains tin.

In another aspect, the manufacturing atmosphere is a substantially non-oxidizing atmosphere.

BRIEF DESCRIPTION OF THE DRAWINGS

The features and advantages of the capturing method, the capturing apparatus and the capturing member used therein according to the present invention over the conventional art will be more clearly understood from the following description of the preferred embodiments of the present invention taken in conjunction with the accompanying drawings in which like reference numerals designate the same or similar elements or sections throughout the figures thereof and in which.

DETAILED DESCRIPTION OF THE PREFERRED EMBODIMENTS

Figure 1A:
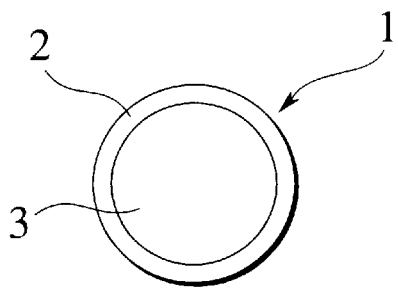
FIG. 1A is a sectional view for explanation of a structure of the solder material of the first type according to the prevent invention.

It is said that tin-zinc solder is inferior to conventional solder in wettability, but it is more inexpensive and lower in fusion temperature. In bonding of electronic parts, it is a very expectable material for practical use because generation of migration is suppressed by use of tin-zinc alloy as compared with tin-lead solder. The reason why tin-zinc solder is inferior in wettability is because zinc is very likely to be oxidized and a zinc oxide film is formed on the fused alloy surface to impede wetting of the alloy on a base metal, which has been confirmed by the present inventors. In other words, in order to substitute the tin-zinc solder for the conventional solder material in practical use, it is necessary to take some measures against oxidation of zinc.

In the present invention proposed is a solder material having a plural-layer structure for enclosing a zinc component with a coating layer of other Material in order to isolate the zinc component composing tin-zinc solder from the surrounding atmosphere. In this construction, the zinc component is disposed inside of the coating layer to decrease or substantially eliminate the area of the zinc component at which the zinc component is exposed to the atmosphere. Accordingly, production of zinc oxide is suppressed until the solder material is heated to be a melted solder, and, as soon as a substantially uniform molten solder is obtained, the material surface is wetted immediately with it to form a favorable solder bond. When the tin-zinc solder is melted, a concentrated layer of zinc is formed on the surface. When this layer is exposed to the atmosphere, a zinc oxide film is formed immediately to impede the wettability of the solder. However, if it contacts with the base metal without being oxidized, a strong solder bond is obtained. In particular, when the base metal is copper, an intermetallic compound of copper and zinc is formed on the interface of the base metal and the solder, and the inventors consider that the formation of this intermetallic compound further contributes to the strength of the solder bond.

The coating layer of the solder material can be formed by using an organic matter that can be easily removed by heating, or a metal other than zinc. If the coating layer is formed with an organic matter that can be easily removed by heating, the coating layer is removed from the members to be bonded by heat while the solder material disposed between the members to be bonded is heated, and a solder bond is formed by metal components of the solder material without the organic matter. Therefore, the coating material has no relation with the composition of the solder for forming the bond. On the other hand, if the coating layer is formed of other metal than zinc, a solder bond is formed of a mixture of the fused metal components of the entire solder material. Therefore, the composition of the solder for forming the bond is determined by the metal composition of the entire solder material. In either case, a multi-layer structure having three layers or more can be constructed by further disposing other metal than zinc at the outer side of the coating layer. However, the following explanation will be directed to a solder material of tin-zinc solder which is constructed by forming the coating layer as the outermost layer. Incidentally, the solder material in a structure having a further layer at the outer side of the coating layer can be obtained by modifying or changing the tin-zinc solder material appropriately according to the description given below. The solder material other than tin-zinc solder can also be provided similarly in the manner disclosed for the tin-zinc solder material of a plural-layer structure according to the invention.

In the first construction that the coating layer is formed with an organic matter that can be removed easily by heating, as shown in a sectional view of FIG. 1A, a solder material 1 has a coating layer 2 and an inner layer 3 located inside of the coating layer 2, and the inner layer 3 contains tin and zinc at a rate corresponding to the composition of tin-zinc solder for forming the bond. The form of the inner layer 3 may be any one of a mixed-layer form comprising a simple tin layer and a simple zinc layer, a uniform form composed of a substantially uniform tin-zinc alloy layer, and a complex form of them. Further, by adding other metal than tin or zinc to the inner layer 3, a ternary alloy solder or multiple-element alloy solder containing tin and zinc may be formed. The solder material in a mixed-layer form of tin and zinc, when it is heated, begins to fuse from the contact portion of the tin and zinc at the temperature of eutectic point of tin and zinc, and a eutectic mixture of tin and zinc is formed. Such fusion and uniforming is promoted in accordance with temperature elevation, and complete fusion is achieved at the liquidus temperature at the metal composition ratio of the entire inner layer 3. Therefore, in order that the solder material can be melted at a low temperature, it is preferred that the metal composition of the entire inner layer 3 of the solder material be close or equal to the eutectic composition of tin and zinc, and so as to fuse quickly, it is further desired that the inner layer 3 be in a uniform state with an alloy layer of tin and zinc. The organic matter for composing the coating layer 2 which can be easily removed by heating is, specifically, a compound which is solid at ordinary temperature and which is dissipated as gas by vaporization or decomposition at a temperature lower than the melting temperature of the solder material, and a substance used as flux of solder paste is preferred. In particular, rosin (turpentine component) or other natural resin is preferred, but it should not be particularly limited.

A linear solder material in a two-layer structure as shown in FIG. 1A is obtained by immersing a wire material for composing the inner layer in a fused matter such as resin for composing the coating layer, taking it out, cooling and solidifying the fused matter, and rolling it as required. By cutting the obtained linear solder material, a granular solder material is obtained.

Figure 1B:
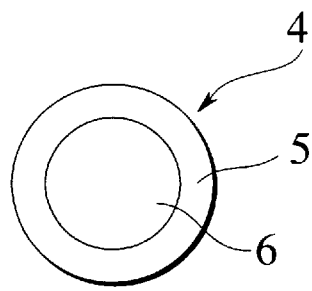
FIG. 1B is a sectional view of the second type solder material according to the present invention.

If the coating layer is formed by other metal than zinc (that is, tin), as shown in FIG. 1B, the inner layer 6 inside of the coating layer 5 of the solder material 4 may be any form of a single-layer form of single zinc layer, a mixed-layer form of a simple tin layer and a simple zinc layer, a uniform form composed of a substantially uniform tin and zinc alloy layer, and a combined form of them. However, the contents of the coating layer 5 and inner layer 6 are determined so that the metal composition or the entire solder material combining the coating layer 5 and inner layer 6 may coincide with the composition of the tin-zinc solder for forming the bond. If other metal than tin or zinc is added to the coating layer 5 or inner layer 6, the solder forming the bond is a ternary alloy solder or a multiple-element alloy solder containing tin and zinc. In heating of the solder 4 in this structure, melt begins from the area in which tin and zinc contact, at the eutectic temperature of tin and zinc, and a tin-zinc eutectic mixture is formed. Uniforming and fusion are promoted in accordance with temperature elevation, and a complete fusion is achieved at the liquidus temperature in the metal composition of the entire solder material. Therefore, in order that the solder material can be melted at a low temperature, it is preferred that the metal composition of the entire solder material be close or equal to the eutectic composition of tin and zinc, and so as to fuse the solder material quickly, it is further desired that the inner layer 6 be in an alloy layer of tin and zinc. To satisfy this condition, for example, the inner layer 6 can be formed by an alloy of a composition slightly lower in the content of tin than the eutectic composition of tin and zinc, and the coating layer 5 may be formed of a small amount of tin so that the composition of the entire solder material may be a eutectic composition of tin and zinc. However, even in a case of a solder material having an inner layer which is not tin-zinc alloy, as far as the size (thickness, diameter, etc.) of the solder material is about several millimeters, it does not actually take much time in fusion and diffusion because heat transfer is completed in a short time. Therefore, as an example of solder material of a sufficiently effective composition for practical use, a solder material in a two-layer structure in which the simple zinc inner layer is covered with a coating layer of tin can be suitably used. This solder material is simple in structure and is easily manufactured without a complicated process, and it is hence very advantageous. Hereinafter, the solder material in a two-layer structure covering the simple zinc layer with a coating layer of simple tin is described below.

Figure 2A:
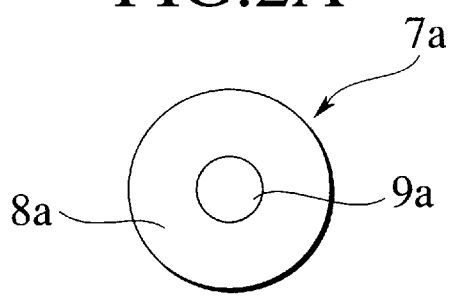
FIGS. 2A to 2F are sectional views respectively showing a structure of the first to sixth embodiments of the solder material of the second type according to the prevent invention.
Figure 2B:
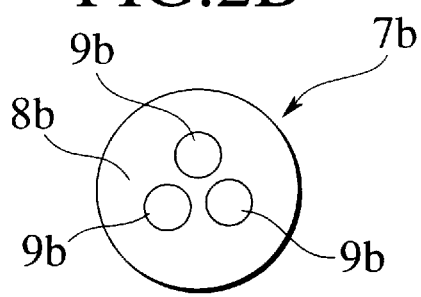
Figure 2C:
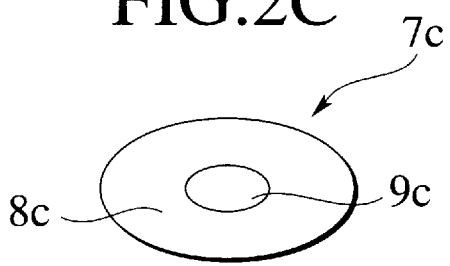
Figure 2D:
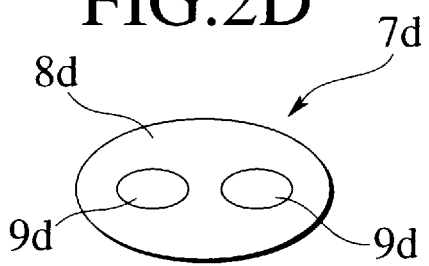
Figure 2E:
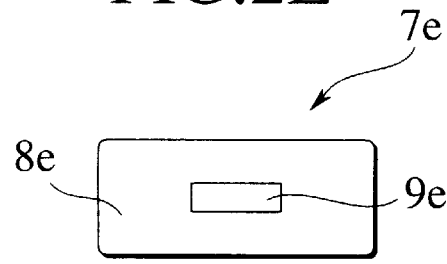
Figure 2F:
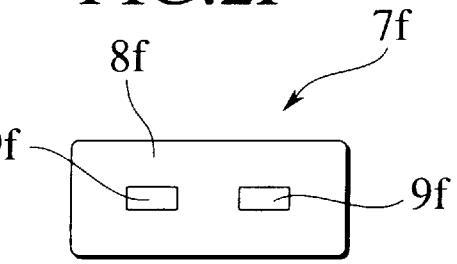

Examples of solder material in a two-layer structure in which the simple zinc layer is covered with a coating layer of simple tin include solder materials 7a, 7b of a a circular sectional shape as shown in FIGS. 2A and 2B, and wires or spherical particles having such sectional shape can be manufactured. In FIG. 2A, one zinc inner layer 9a is covered with a tin coating layer 8a, and in FIG. 2B, plural zinc inner layers 9b are covered with a tin coating layer 8b. It is also possible to manufacture linear or spheroidal solder materials 7c, 7d having an elliptical sectional shape as shown in FIGS. 2C and 2D, and linear, columnar or polyhedral solder materials 7e, 7f each comprising a zinc having inner layer 9e, 9f and a tin coating layer 8e, 8f sectional shapes as shown in FIGS. 2E and 2F. Even in the case of such sectional shapes, the plural zinc inner layers 9d or 9f can be covered with a tin coating layer 8d or 8f as shown in FIGS. 2D and 2F.

Manufacture of the solder material having a two-layer structure with a sectional shape as shown in FIGS. 2A to 2F is based on manufacture of a linear solder material with a two-layer structure, and a granular solder material can be manufactured by using that linear solder having a two-layer structure. First, manufacture of the linear solder material is described below.

The linear solder material in a two-layer structure can be easily manufactured by winding a bar or lump of zinc with a thin layer of tin, and rolling it gradually by using a rolling mill or the like to draw into a thin wire of a uniform thickness. The amounts of the thin layer of tin and of the bar or lump of zinc to be used should correspond to the composition rate of the solder bond to be formed. Preferably, tin is used by 85 to 97 parts by weight and zinc by 3 to 15 parts by weight. When rolling the wound material, it is preferred to heat it to a temperature not to melt tin and zinc, that is, a lower temperature than the eutectic temperature of tin and zinc, preferably about 50 to 198° C., in order that the tin and zinc may be drawn easily. By this method, a linear solder material of about 2 μm to 20 mm in diameter, and about 1 μm to 10 mm in average diameter of zinc inner layer of section can be easily manufactured. It is also possible to roll and form into a thick bar of solder material or a thin sheet of solder material by means of biaxial drawing, and solder materials of such shapes can be obtained in accordance with the present invention. A linear solder materials with a polygonal section as shown in FIGS. 2E or 2F is obtained by adjusting the application of pressure in the rolling process, or firstly rolling the material and linearly drawing it into a linear solder material having a circular section and secondly pressing and forming it with a die into a linear solder material with a polygonal section. In the linear solder material thus obtained, the portion of the zinc exposed to the atmosphere is only a slight part at the terminal ends, and it is substantially isolated from the atmosphere. (It is off course possible to prepare a linear solder material in which the terminal end parts of the zinc portion are also covered with tin.) Therefore, it can be used in same handling as of wire solder made of tin alone or tin-lead alloy, and hence soldering can be done preferably by using an ordinary soldering iron. Oxidation of zinc during soldering operation can be substantially suppressed, and the solder material exhibits a favorable wetting to the members to be bond. A favorable solder bond can be formed in the atmospheric condition.

The linear solder material in a two-layer structure can be manufactured by other manufacturing methods. For example, using a bar or wire of zinc and molten tin, the temperature of the molten tin is held at a temperature slightly higher than the melting point of tin, and a zinc wire is immersed therein for a short time and is taken out immediately, and the molten tin adhering to the wire or bar of zinc is then cooled and solidified. Preferably, the zinc wire or bar should be cooled before immersing into the molten tin. Then the zinc wire or bar coated with tin is properly rolled and drawn to a desired diameter, so that a linear solder material is obtained. Alternatively, a thin tin wire or tin foil is densely wound in a coil form around the zinc wire, and it is rolled by a rolling mill and drawn to a desired diameter, so that a linear solder material is obtained. At this time, if a tin wire and a rosin wire are wound together around the zinc wire, a linear solder material having a coating layer composed of tin and rosin is obtained.

In the linear solder material 4 as shown In FIG. 1B, the outer diameter of the coating layer 5, that is, the outer diameter d1 of the solder material 4 and the diameter d2 of the inner layer 6 should be preferably within a range specified in formula (1).

$$(1/100)d1 \leq d2 < d1 \tag{1}$$

Particularly, when the diameter d2 of the inner layer 6 including zinc is 1 μm to 3 mm on the average, the scope expressed by the following equation (2) is preferable. To provide a plurality of inner layers in solder material as shown FIGS. 2B, 2D, or 2F, it is preferable that d2 is smaller than one fourth of d1.

$$(1/90)d1 \leq d2 < (999/1000)d1 \tag{2}$$

Figure 3A:
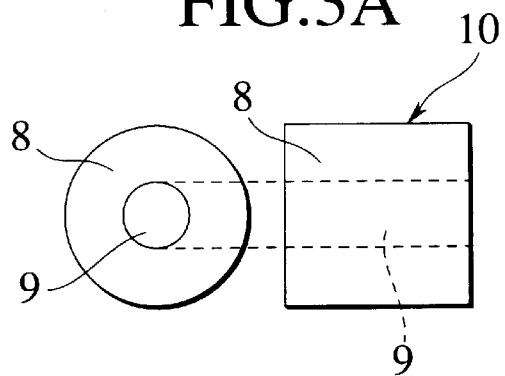
FIGS. 3A to 3D are illustrations respectively showing a structure of the first to fourth embodiments of the granular solder material according to the present invention, and the left part of each illustration is an end view and the right part is side view.

The granular solder material is manufactured by using a linear solder material having a two-layer structure mentioned above. First, the linear solder material is cut in a direction intersecting the axis of the linear solder material to produce a cylindrical solder piece 10, as shown in FIG. 3A, in which a tin coating layer 8 encloses a zinc inner layer 9, axially centered around the zinc inner layer 9. In FIG. 3A, the linear solder material is cut vertically to the axis along its radial direction, but it may be also cut obliquely. Next, this cylindrical solder piece 10 is supplied on a vibrating heating plate, the tin coating layer 8 is deformed by collision of corners of the solder piece 10 and the plate due to vibration and by hear, and the tin coating layer 8 becomes round while gradually covering the both terminal ends of the zinc inner layer 9. As a result, the solder piece finally becomes a spherical form as a solder piece 11 shown in FIG. 3B. Therefore, by properly adjusting the heating temperature of the heating plate and the residence time of the solder piece, the zinc inner layer 9 is completely covered with the tin coating layer 8 and a nearly spherical granular solder material is obtained. Instead of supplying the cylindrical solder piece 10 on the vibrating heating plate, it may be rolled on an inclined heating plate. In this case, it is preferred that the temperature of the heating plate is set higher for the ease of softening of tin, and the rolling time on the heating plate is shortened so that the internal temperature of the solder piece may not be raised. In this manner, the solder material almost completely covering the zinc inner layer 9 is favorably obtained, while only the tin coating layer 8 is thermally deformed. In this method, a granular solder material with mean particle size of about 2 μm to 20 mm can be suitably obtained.

In the solder piece shown in FIG. 3A, since the zinc inner layer 9 is exposed to the atmosphere at cut sections at both ends, oxides are formed in these areas. However, as compared with the volume of the zinc inner layer 9, the exposed surface is very small. Accordingly, it can be regarded as being substantially isolated from the atmosphere, and there is few practical problem. Therefore, even when the solder piece of FIG. 3A is used as granular solder material, the object of the invention can be achieved to a certain extent. Moreover, if the linear solder material is cut into solder pieces by using a pair of force-cutting blades so as to pinch the linear solder material, a solder piece 12 in which the zinc inner layer 9 is hardly exposed to the atmosphere as shown in FIG. 3C can be obtained, as being accompanied by plastic deformation of metal. By rotating the cutting direction of the force-cutting blades on every section by 90 degrees with respect to the axial direction of the linear solder, a solder piece 13 as shown in FIG. 3D is obtained. Such solder pieces 12, 13 substantially have the same effects as the solder piece 11, and they can be effectively used as the granular solder material of the invention. A cutting device having multiple force-cutting blades in the form of an iris diaphragm may be also used. The shape of the cut section formed by force cutting can be adjusted by the shape of the force-cutting blades and the cutting speed. In manufacture of the solder piece 13 of FIG. 3D, if force-cutting blades such that the inclination of the cut section is large is used, and if the solder piece is manufactured so that the axial length of the solder piece may be shorter, a granular solder material in a nearly tetrahedral shape can be obtained. If a heated force-cutting blade is used, plastic deformation of the linear solder material is easier, and the cut section of the zinc inner layer can be easily covered with a thin film of tin, thereby enhancing the efficiency of cutting operation and the coating performance of the zinc inner layer by tin.

Figure 3B:
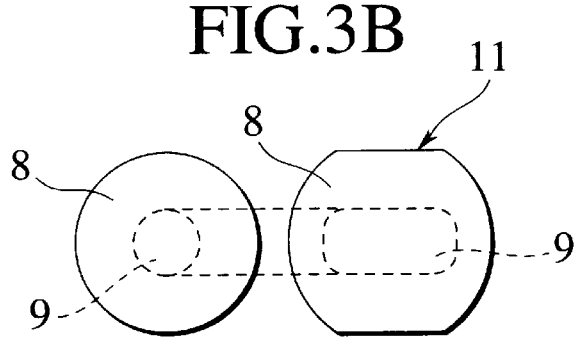
Figure 3C:
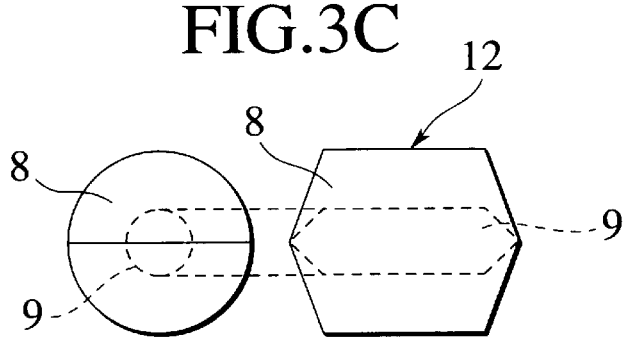
Figure 3D:
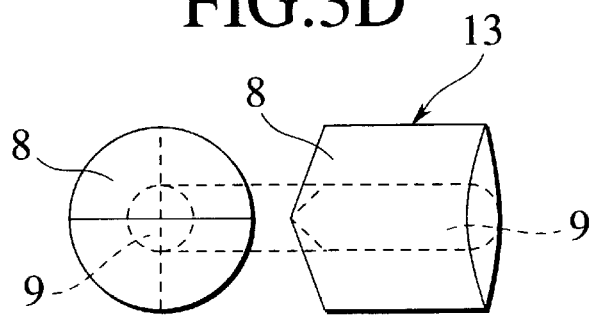
Figure 4A:
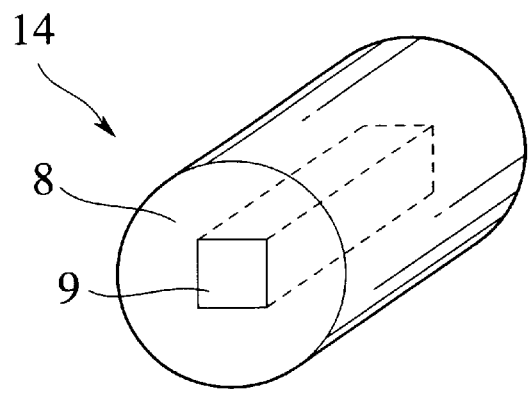
FIGS. 4A to 4C are perspective views respectively showing a structure of three other embodiments of the solder material of the second type according to the present invention.
Figure 4B:
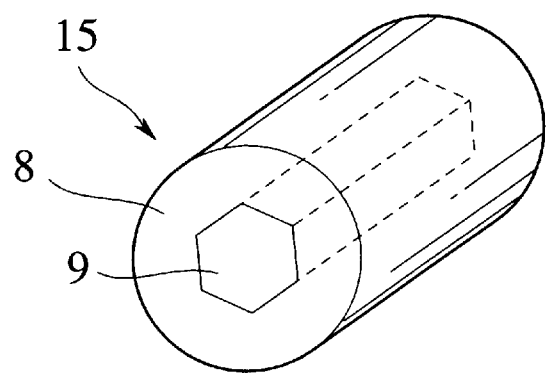
Figure 4C:
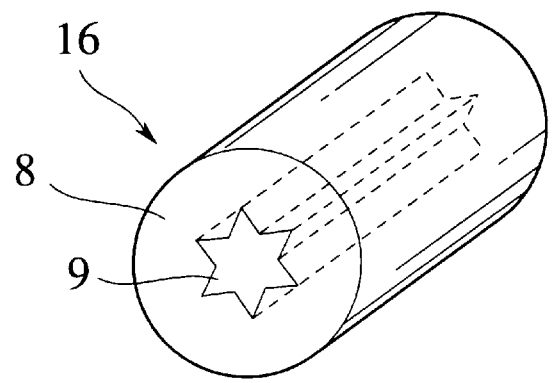

When granular solder materials are formed according to the above manufacturing methods by using linear solder materials having sectional shapes as shown in FIGS. 2B to 2F, granular solder materials having a structure similar to the solder pieces 11 to 13 shown in FIGS. 3B to 3D, with the zinc inner layer 9 covered with the tin coating layer 8 are obtained. Moreover, the aforesaid manufacturing methods of linear solder materials and granular solder materials can be applied to manufacture of solder materials having the coating layer made of other metal than tin or solder materials having an inner layer and a coating layer either of which is made of alloy. That is, by operating similarly with use of a thin-sheet metal material for composing the coating layer and a metal bar or lump for composing the inner layer, linear solder materials and granular solder materials in a two-layer structure of a desired composition can be obtained according to the present invention. It is also possible to manufacture linear solder materials and granular solder materials in a structure having multiple tubular and concentric layers. Depending on the degree of heating in the rolling process and granulating process, there are cases where the inner layer and coating layer may be fused to be continuous in the contacting area. Even in such a case, unless the zinc in the inner layer is diffused to the outer surface of the coating layer, it is possible to suppress oxidation of zinc due to atmosphere during soldering operation, and the solder materials conforming to the purpose of the invention are obtained.

Other examples of the solder material according to the present invention are shown in FIGS. 4A to 4C and FIGS. 5A to 5F FIGS. 4A to 4C show cylindrical solder materials 14, 15, 16 heaving the zinc inner layer 9 of square, regular hexagonal and star sectional shape covered with the tin coating layer 8. They can be also manufactured by applying the manufacturing method mentioned above. For example, they can be obtained by repeating the process of immersing the zinc bar material of square, regular hexagonal or star sectional shape in molten tin and cooling and solidifying the tin by a necessary number of times to form a tin coating layer of a desired thickness, and rolling into thin wires. Alternatively, using ultra-thin zinc wires and tin wires, the zinc wires and the tin wires are piled and laminated in multiple layers in a section similar to the shape in FIGS. 4A to 4C, and compressed to form a bar, and this bar is rolled to process into thin wires. Or, these methods may be combined with the manufacturing methods mentioned above. If the obtained wire solder material is granulated by the cutting method described above with reference to FIGS. 3A to 3D, granular solder materials having zinc layer of square, regular hexagonal and star sectional shape inside may be obtained. Such solder materials are large in the ratio of the volume of the zinc inner layer 9 to the area of the boundary surface between the tin coating layer 8 and Zinc inner layer 9, and hence excellent n the speed of uniforming the inside composition when fusing the solder material.

Figure 5A:
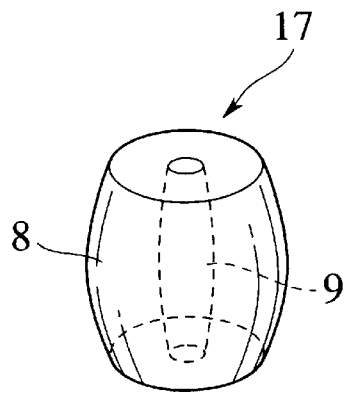
FIGS. 5A to 5F are perspective views respectively showing a structure of six other embodiments of the granular solder material according to the present invention.
Figure 5B:
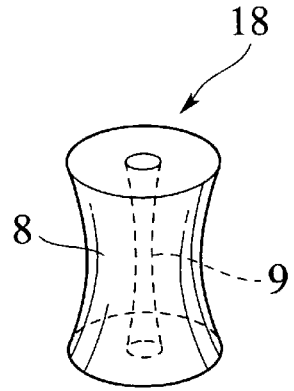
Figure 5C:
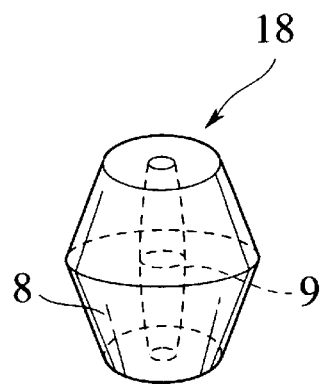

FIGS. 5A to 5F show practical examples of granular solder materials that can be manufactured according to the invention. Granular solder materials 17, 18, 19 in FIGS. 5A to 5C are obtained by pressing and forming by applying a force in the axial direction or radial direction when granulating by cutting the wire solder materials. Specifically, they are obtained by cutting and granulating after forming a curved side portion by applying a force in the radial direction at the end of the wire solder material. In particular, the granular solder material 17 in FIG. 5A may be also obtained by compressing in the axial direction simultaneously when cutting into solder pieces. Aside from them, granular solder materials of conical shape, truncated conical shape, pyramidal shape or truncated pyramidal shape can be manufactured similarly.

Figure 5D:
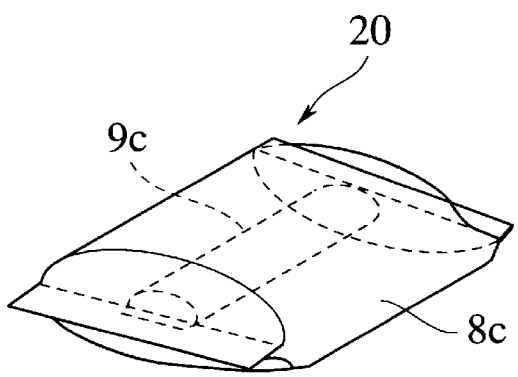
Figure 5E:
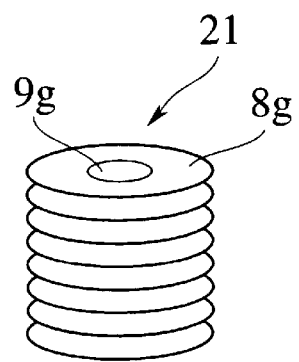
Figure 5F:
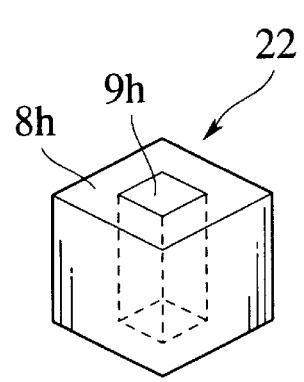

A granular solder material 20 shown in FIG. 5D is obtained by squeezing and closing the end by pressing and cutting operation when cutting the wire solder of elliptical sectional shape as shown in FIG. 2C, and a tin coating layer 8c in a bag shape covers a zinc inner layer 9c. A granular solder material 21 shown in FIG. 5E is obtained by cutting off the wire solder winding a tin coating layer 8g around a columnar zinc inner layer 9g in a coil form, and a granular solder material 22 in FIG. 5F is obtained by cutting the wire solder material having square tin coating layer 8h and zinc inner layer 9h. The granular solder materials 17 to 22 shown in FIGS. 5A to 5F are possibly positioned and fixed without rolling when placed on a flat surface, and it is very convenient when soldering by placing between the members to be bonded.

These granular solder materials are manufactured from wire solder materials of a plural-layer structure, and hence the structure of the granular solder materials commonly has features originated from tie wire solder materials owing to the manufacturing method. That is, the inner layer of the granular solder material has a shape having an axiality such that elongates in a uniaxial direction as clear from FIGS. 3A to 5F, and the coating layer is covering the inner layer so as to surround the axis of the inner layer. Even when the grain shape of the solder material is formed in a true spherical form, the inner layer has an axial shape extended thinly, and it is considered rare that the inner layer is formed in a non-stretched shape such as true spherical shape.

Figure 6A:
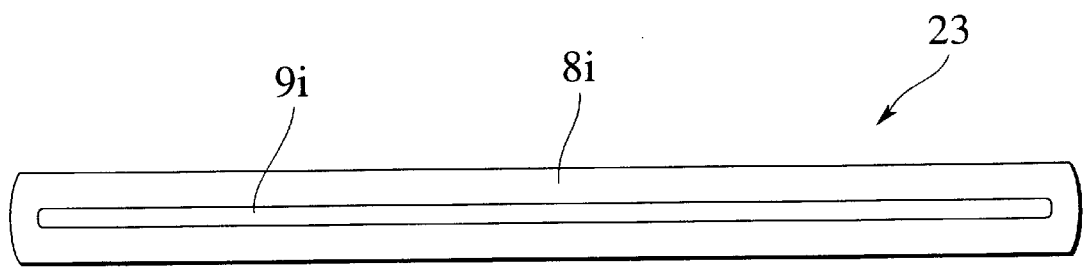
FIGS. 6A and 6B are sectional views respectively showing a structure of the first and second embodiments of the sheet solder material according to the present invention.
Figure 6B:
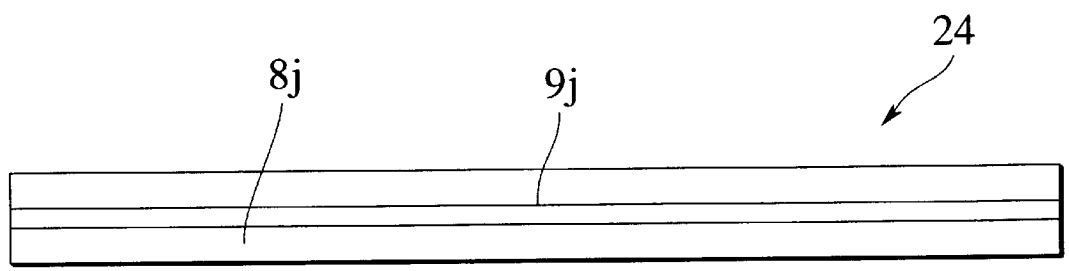

As described above, the linear solder materials and granular solder materials are obtained by winding a tin material for composing the coating layer around a zinc bar or zinc lump for composing the inner layer and by drawing it uniaxially. Here, if the wound material is drawn biaxially in the rolling process, instead of the linear solder material, a sheet solder material 23 having a sectional shape as shown in FIG. 6A is formed, in which a zinc inner layer 9i is completely covered with a tin coating layer 8i. On the other hand, if a zinc plate is inserted between two tin plates and biaxially drawn, a sheet solder material 24 having a sectional shape as shown in FIG. 6B is formed, in which a zinc inner layer 9j is exposed from a tin coating layer 8j in the edge area (however, in this method, also the sheet as shown in FIG. 6A can be manufactured by controlling the manner of rolling). By ordinary drawing operation, a sheet solder material having a same thickness as ordinary metal thin plate or metal foil can be fabricated.

Figure 7:
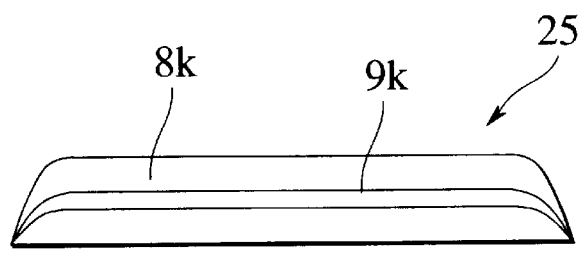
FIG. 7 is a sectional view showing a structure of an embodiment of the thin solder piece according to the present invention.

From such sheet solder material, a thin solder fragment 25 having a sectional shape as shown in FIG. 7 is obtained by means of cutting technique using pressure such as blanking process. The end of this thin solder fragment 25 is squeezed sane ds in FIG. 3C or FIG. 3D, and a zinc inner layer 9k is hardly exposed from a tin coating layer 8k. By adjusting the cutting operation, a tin solder fragment having a sectional shape which has cut edges similar to those of FIG. 3C can be also obtained. If the sheet solder material is processed into a tape form, ease of handling and ease of using when soldering are improved to be equivalent to linear solder materials. The tape solder material can also be manufactured by directly pressing the linear solder material and drawing flatly. In this case, the sectional shape of the tape solder material is as shown in FIG. 6A.

The thin solder fragment 25 of FIG. 7 can be formed into various flat shapes as required, such as circular, elliptical and polygonal shapes. In a case of soldering, for example, a pair of base metals having a circular junction, if the thin solder fragment 25 is formed into a disk in almost same size as the junction, the thin solder fragment 25 can be stably placed between the base metals, and the base metals can be bonded easily by heating and fusing the thin solder fragment 25. Even by using solder fragments of square or regular hexagonal shape, favorable bonding is actually obtained because the fused solder quickly diffuses on the junction. The square or regular hexagonal shape is advantageous because solder fragments can be manufactured from sheet solder material with a minimum material loss.

When soldering by using a thin solder fragment, as required, flux may be applied on the base metal surface or the surface of the thin solder fragment 25, before the thin solder fragment 25 is placed between base metals to bond. As the flux to be used in this case, any material capable of activating by removing the oxide film from the surface of the base metals to be bonded, that is, an the junction surface may be properly selected.

If the base metals to be bonded have enough mechanical strength. a sheet solder material as shown in FIG. 6A or 6B may be spread over the base metal and blanked on the base metal. In this case, by properly adjusting the pressure applied by blanking or the temperature of the solder material, a cut thin solder fragment can be pressed and adhered onto the base metal without damaging the base metal, so that handling is easier in the subsequent soldering operation.

Different from the solder materials shown in FIGS. 1A to 5F, the solder materials shown in FIGS. 6A. 6B and FIG. 7 are drawing in two directions, and the inner layer has a bidirectionally elongated or plane shape having axiality and planeness, and the coating layer covers the both sides of the inner layer. That is, the solder material has a laminate structure.

Oxidation of metal progresses very rapidly particularly in the fused state. When a uniform tin-zinc solder is heated, the solder is fused from the surface according to conduction of heat, and until the entire solder is fused, a zinc oxide is easily formed on the surface. However, in the case of the solder material in a two-layer structure covering the inner layer by zinc alone by the coating layer of tin alone, since fusion of solder takes places from the contact interface of the tin and zinc, that is, from inside of the solder material. Accordingly, when the solder material surface is fused by fusion and diffusion or zinc, the entire solder is completely fused and immediately spreads over the surface of the base metal to contact, so that the zinc is hardly oxidized by the atmosphere. Therefore, the solder material having a two-layer structure of tin and zinc commonly save the advantage of, regardless of the shape, suppressing wettability due to oxidation of zinc.

Moreover, in the case of the granular solder material in a two-layer structure of tin and zinc, when a solder paste is prepared by mixing it with flux, degeneration of paste due to reaction of highly reactive zinc and flux is prevented, and the quality stability of the paste is enhanced, and hence the selection of materials usable as flux extends to a wider range. This can be easily understood from the fact that, when a few solder pastes are prepared by using a tin-zinc alloy solder granulated in a different particle size, respectively, the solder paste with larger solder particles is higher in preservation stability than that with smaller solder particles.

In the present invention, it is of course possible to combine two or more kinds of granular solder material which are different in composition to prepare a solder paste. For example, a simple tin granular solder and a two-layer granular solder of tin and zinc as described above may be combined to use in one solder paste.

In the above manufacture of solder materials, it is desired to prevent oxidation of raw materials by working in the non-oxidizing atmosphere with the oxygen concentration of 100 ppm or less, in order to keep the oxygen concentration contained in the obtained solder materials at 100 ppm or less.

The manufacturing methods of linear solder material, granular solder material, sheet solder material, and thin solder fragment by using a rolling process described above are realized by utilizing malleability and ductility of metals, and are hence applicable also in manufacture of not only solder materials in a two-layer structure of tin and zinc, but also solder materials in a two-layer or multiple-layer structure using other metal or alloy. In order to improve the performance of solder materials, bismuth, indium, silver or the like may be added as a third component. The third component may be added in either coating layer or inner layer depending on its properties, and the added layer may form either an alloy or a mixture of simple layers of each component. In any case, it is desired to construct the layer structure in consideration of the fusion temperature (solidus temperature) in possible combination of each component so that fusion may not initiate from the surface of the solder material.

As is evident from the above description, the solder material according to the present invention is usable in place of the conventional solder, and it is applicable nor only bonding for assembling in manufacture of machines and apparatuses, but also formation of fine bonds in semiconductor field. For example, bonding in a cable connector often used in connection of personal computer and printer, bonding in optical connector often used in transmission cable, bonding of a radiator of vehicle, mounting of parts onto a substrate and the like is possibly formed. If classified in terms of substrate mounting style, single surface mounting, double surface mounting, double surface mounting equipped with lead attached parts, single surface mounting equipped with lead attached parts, lead through mounting, and the like are provided. The mounting part include ceramic, capacitor, inductor, jumper, transistor, diode, aluminum electrolytic capacitor, tantalum semi-fixed resistor, trimmer, coil and the like, as a passive part. As an active part, it includes IC and SI, which are typical parts. If classified depending on external shape and configuration of the package, SOIC, SOP, QIP, QFP, PLCC, LCC, SOJ, MSF, BGA, FC-BGA, CSP, PLC, MCM, OE-MCM, and high density mounting device in which chips are stacked are available.

EXAMPLES

Referring now to the examples, the invention is more specifically described below.

EXAMPLE 1

In a glove box filled with nitrogen atmosphere at oxygen concentration of 100 ppm or less, a zinc wire of purity of 99.99% by weight, which was measured to 9 g beforehand, was placed. Then 91 g of a tin foil of purity of 99.98% by weight was tightly rolled and fixed on the zinc wire. The diameter of this roll wound with the tin foil was 5 mm. This roll was drawn by a rolling mill to gradually reduce the diameter of the roll, firstly from a 5 mm to 3.5 mm, next from 3.5 mm to 2 mm, then from 2 mm to 1.2 mm, and finally from 1.2 mm to 0.8 mm, thereby a wire of 0.8 mm in diameter was obtained. Taking up this wire, a part of the wire was used as a sample for measurement of oxygen content. The oxygen content of the sample was 50 ppm or less, and the tin content on the outer surface of the wire was 95% by weight or more.

Next, heating a soldering iron to 320° C., and using this soldering iron and the above wire, reinforcing soldering was performed on a defective Junction of a QFP type package of a substrate for a personal computer (208 pins, gold flush plating finish, 0.5 mm pitch) coated with RMA type flux. As a result, the wire was fused by the soldering iron and it exhibited an excellent wetting and spread over the defective junction to fill up the gap between the pad and the lead, thereby a favorable reinforcement by solder was achieved.

EXAMPLE 2

In a glove box filled with nitrogen atmosphere at oxygen concentration of 100 ppm or less, a tin material of purity of 99.98% by weight, which was preliminary measured to 182 g, was heated and melted in a slender crucible. A temperature indicator using a thermocouple was placed in the molten tin, and the molten tin was gradually cooled until the central part of the molten tin was cooled to 235° C. Then 18 g of a zinc wire having purity of 99.99% by weight was immersed in the molten tin and taken our immediately to cool it sufficiently. As a result, the zinc wire coated with solidified tin was obtained. The mean diameter of this wire was 10 mm. This wire was drawn by a rolling mill to gradually reduce the diameter of the wire, firstly from 10 mm to 7.5 mm, secondly from 7.5 mm to 5 mm, further from 5 mm to 3 mm, and finally from 3 mm to 2 mm, thereby a wire of 2 mm in diameter was obtained. Taking up this wire, a part of the wire was used as a sample for measurement of oxygen content. The oxygen content of the sample was 50 ppm or less, and the tin content on the outer surface of the wire was 95% by weight or more.

Next, heating a soldering iron to 320° C., and using this soldering iron and the above wire, reinforcing soldering was performed on a defective junction of a QFP type package of a substrate for a personal computer (208 pins, gold flush plating finish, 0.5 mm pitch) coated with RMA type flux. As a result, the wire was fused by the soldering iron and it exhibited an excellent wetting and spread over the defective junction to fill up the gap between the pad and the lead, thereby a favorable reinforcement by solder was achieved.

EXAMPLE 3

In a glove box filled with nitrogen atmosphere at oxygen concentration of 100 ppm or less, a zinc wire of purity of 99.99% by weight, which was measured to 9 g beforehand, was placed. Then 54.6 g of a tin foil of purity of 99.98% by weight and three gum rosin wires in total amount of 8.1 g were tightly rolled and fixed together on the zinc wire. The diameter of the roll with the wound wires was 5 mm. This roll was drawn by a rolling mill to gradually reduce the diameter of the roll, firstly from 5 mm to 3.5 mm, next from 3.5 mm to 2 mm, then from 2 mm to 1.2 mm, and finally from 1.2 mm to 0.8 mm, thereby a wire of 0.8 mm in diameter was obtained. Taking up this wire, a part of the wire wag used as a sample for measurement of oxygen content of the metal portion. The oxygen content of the metal portion of the sample was 100 ppm or less, and the tin content of the tin portion on the outer surface of the wire was 95% by weight or more.

Next, heating a soldering iron to 320° C., and using this soldering iron and the above wire, a reinforcing soldering was performed on a defective junction of a QFP type package of a substrate for a personal computer (208 pins, gold flush plating finish, 0.5 mm pitch) coated with RMA type flux. As a result, the wire was fused by the soldering iron and the molten metal exhibited an excellent wetting and spread over the defective junction to fill up the gap between the pad and the lead, thereby a favorable reinforcement by solder was achieved. At this time, it is considered that the gum rosin was gasified after acting same as the flux used in solder paste.

EXAMPLE 4

Using a cutter having wedge blades, the wire obtained in Example 1 was cut and granulated to tubular pellets of 1.5 mm while observing with a magnifier. The pellets were sucked by a straw and arranged on a solder bump of a substrate for mounting BGA type chips (20 pins). On this substrate, a BGA type chip was disposed at a predetermined position by using a chip mounter, while reflowing with a nitrogen flow at oxygen concentration of 500 ppm or less was performed at maximum heating temperature of 230° C. As a result of the reflowing, the pellets were fused to form molten solder which presented a favorable wetting and bonded the substrate and the BGA type chip.

EXAMPLE 5

In a glove box filled with nitrogen atmosphere at oxygen concentration of 100 ppm or less, a tin material of purity of 99.99% by weight, which was preliminarily measured to 91 g, was heated and melted in a crucible. In the molten tin, 9 g of a zinc material of purity of 99.99% by weight was added and fused, and it was stirred uniformly by using a clean stainless steel spoon. This molten metal was poured into a cylindrical die, and cooled and solidified. Then, a solidified cylindrical alloy was taken out of the die. The diameter of This cylindrical alloy was 5 mm. This alloy was drawn by a rolling mill to gradually reduce the diameter of the roll, firstly from 5 mm to 3.5 mm, next from 3.5 mm to 2 mm, then from 2 mm to 1.2 mm, and finally from 1.2 mm to 0.8 mm, thereby a wire of 0.8 mm in diameter was obtained. Moreover, a low melting point flux mainly composed of gum rosin (WW system, manufactured by Senju Metal Industry Corporation of Adachi-ku, Tokyo, Japan) was melted. The wire obtained above was immersed in the flux and taken out, and cooled and taken up. Taking up this wire, a part of the wire was used as a sample for measurement of oxygen content. The oxygen content in metal portion of the sample was 50 ppm or less, and composition of the metal portion was almost uniform.

Next, heating a soldering iron to 320° C., and using this soldering iron and the above wire, reinforcing soldering was performed on a defective junction of a QFP type package of a substrate for a personal computer (208 pins, gold flush plating finish, 0.5 mm pitch) coated with RMA type flux. As a result, the wire was fused by the soldering iron and the molten metal exhibited an excellent wetting and spread over the defective junction to fill up the gap between the pad and the lead, thereby a favorable reinforcement by solder was achieved.

As described herein, the solder material having a plural-layer structure according to the present invention, containing no lead, is usable in the atmospheric condition and exhibits an excellent wetting. This is usable in bonding and assembling of various members. Moreover according to the manufacturing method of The solder material of the present invention, solder materials having such plural-layer structure can be easily manufactured, and solder materials of high quality can be provided.

It must be understood that the invention is in no way limited to the above embodiments and that many changes may be brought about therein without departing from the scope of the invention as defined by the appended claims.

What is claimed is:

1. A solder material for making a solder connection, comprising
   a first layer composed of a first metallic material comprising zinc, and
   a second layer composed of a second metallic material which comprises tin but which does not substantially contain zinc, the first layer being formed in an elongated shape having axiality, and the second layer covering the first layer to surround the axis of the first layer.

2. The solder material of claim 1, wherein the solder material is a substantially binary solder material which contains zinc at a content of approximately 3 to 12% by weight, and wherein the oxygen content of the solder material is 100 ppm or less.

3. The solder material of claim 1 in a form of a wire.

4. The solder material of claim 1 in a planar form selected from the group consisting of a sheet, a tape and a planar fragment.

5. The solder material of claim 1 in a form of a granule.

6. The solder material of claim 5, wherein thegranule is round or substantially spherical.

7. The solder material of claim 1, comprising a diameter about said axis of about 2 μm to 20 mm.

8. The solder material of claim 1, wherein said first layer comprises a diameter about said axis of about 1 μm to 10 mm.

9. The solder material of claim 1, comprising an outer diameter d1 about said axis and wherein said first layer comprises a diameter d2 about said axis, wherein said d2 is smaller than one fourth of said d1.

10. The solder material of claim 1, comprising an outer diameter d1 about said axis and wherein said first layer comprises a diameter d2 about said axis, said d1 and d2 satisfying for following formula (2):

$$((1/90) \times d1) \leq d2 < ((999/1000) \times d1) \qquad (2).$$

11. The solder material of claim 1, wherein each of said first and second layers independently further comprises at least one selected from the group consisting of bismuth, indium and silver.

12. The solder material of claim 1, wherein said second layer further comprises at least one selected from the group consisting of rosin and natural resin.

13. The solder material of claim 1, comprising an outer diameter d1 about said axis and wherein said first layer comprises a diameter d2 about said axis, said d1 and d2 satisfying for following formula (1):

$$((1/100) \times d1) \leq d2 < d1 \qquad (1).$$

14. The solder material of claim 13, wherein said d2 is 1 μm to 3 mm.

15. The solder material of claim 1, further comprising a plurality of first layers each composed of a first metallic material comprising zinc, wherein each of the first layers is formed in an elongated shape having axiality, and wherein the second layer covers the first layers to surround the axes of the first layers.

16. The solder material of claim 15, comprising an outer diameter d1 about a central axis and wherein each of said first layers comprises a diameter d2, wherein said d2 is smaller than one fourth of said d1.

17. A solder material for making a solder connection, comprising:
   a first layer composed of a first metallic material comprising zinc; and
   a second layer composed of a second metallic material which comprises tin but which does not substantially contain zinc, the first layer being formed in an elongated shape having axiality, and the second layer covering the first layer to surround the axis of the first layer,
   and wherein the solder material is in the form of a wire or a granule.

18. The solder material of claim 17, wherein the solder material is a substantially binary solder material which contains zinc at a content of approximately 3 to 12% by weight, and wherein the oxygen content of the solder material is 100 ppm or less.

19. The solder material of claim 17, comprising a diameter about said axis of about 2 μm to 20 mm.

20. The solder material of claim 17, wherein said first layer comprises a diameter about said axis of about 1 μm to 10 mm.

21. A solder material for making a solder connection, comprising:
   a plurality of first layers each composed of a first metallic material comprising zinc; and
   a second layer composed of a second metallic material which comprises tin but which does not substantially contain zinc, each of the first layers being formed in an elongated shape having axiality, and the second layer covering the first layers to surround the axes of the first layers.

* * * * *